US010294422B2

(12) United States Patent
Wang

(10) Patent No.: US 10,294,422 B2
(45) Date of Patent: May 21, 2019

(54) ETCHING COMPOSITIONS FOR TRANSPARENT CONDUCTIVE LAYERS COMPRISING SILVER NANOWIRES

(71) Applicant: Hailiang Wang, Camarillo, CA (US)

(72) Inventor: Hailiang Wang, Camarillo, CA (US)

( * ) Notice: Subject to any disclaimer, the term of this patent is extended or adjusted under 35 U.S.C. 154(b) by 0 days.

(21) Appl. No.: 15/197,941

(22) Filed: Jun. 30, 2016

(65) Prior Publication Data

US 2017/0015903 A1    Jan. 19, 2017

Related U.S. Application Data

(60) Provisional application No. 62/193,218, filed on Jul. 16, 2015.

(51) Int. Cl.
*C09K 13/00*   (2006.01)
*C09D 11/30*   (2014.01)
(Continued)

(52) U.S. Cl.
CPC .............. *C09K 13/00* (2013.01); *C09D 11/02* (2013.01); *C09D 11/30* (2013.01); *C23F 1/02* (2013.01); *C23F 1/10* (2013.01); *H05K 3/067* (2013.01); *H05K 2201/0108* (2013.01); *H05K 2201/026* (2013.01)

(58) Field of Classification Search
CPC ......... B66F 9/22; C09D 11/30; C09D 137/00; C09D 47/00; C09D 5/24; C09D 11/02; C09D 147/00; C09K 13/00; C23F 1/02; C23F 1/10; G06F 2203/04103; G06F 2203/04112; G06F 3/041; H05K 2201/0108; H05K 2201/026; H05K 3/067

USPC .... 252/79.1, 79.2, 79.3, 79.4; 438/745, 750, 438/754, 692, 693
See application file for complete search history.

(56) References Cited

U.S. PATENT DOCUMENTS 7,173,778 B2   2/2007   Jing et al.
8,049,333 B2   11/2011  Alden et al.
(Continued)

FOREIGN PATENT DOCUMENTS

EP    2275841 A2    1/2011

OTHER PUBLICATIONS

Poor, Alfred "How it Works: The Technology of Touch Screens" Computerworld, Oct. 17, 2012. Printed Mar. 8, 2014. Nine (9) printed pages. http://www.computerworld.com/s/article/9231961/How_it_works_The_technology_of_touch_screens?pageNumber=1.
(Continued)

*Primary Examiner* — Lan Vinh
(74) *Attorney, Agent, or Firm* — Fikret Kirkbir

(57) ABSTRACT

This invention in general relates to a transparent conductive layer comprising a silver nanowire. This invention further relates to an etching composition suitable for etching a transparent conductive layer comprising a silver nanowire to form a pattern. This invention further relates to a transparent conductive electrode manufactured by etching a transparent conductive film comprising a silver nanowire. The etching composition may comprise an oxidizing agent and a ligand. The oxidizing agent may be a first chemical compound that can react with silver metal to form a silver compound; and the ligand may be a second chemical compound that can react with the silver compound to form a water soluble coordination complex of the silver ion.

38 Claims, 10 Drawing Sheets

(51) Int. Cl.
*C23F 1/02* (2006.01)
*H05K 3/06* (2006.01)
*C23F 1/10* (2006.01)
*C09D 11/02* (2014.01)

(56) References Cited

U.S. PATENT DOCUMENTS

| | | | |
|---|---|---|---|
| 8,247,468 B2 | 8/2012 | Yoneyama et al. | |
| 8,564,314 B2 | 10/2013 | Shaikh et al. | |
| 8,603,574 B2 | 12/2013 | Huang et al. | |
| 8,704,112 B2 | 4/2014 | Choi et al. | |
| 8,730,179 B2 | 5/2014 | Rosenblatt et al. | |
| 8,766,127 B2 | 7/2014 | Chang et al. | |
| 8,797,282 B2 | 8/2014 | Lyon et al. | |
| 8,803,823 B2 | 8/2014 | Chang et al. | |
| 9,207,824 B2 | 12/2015 | Wang | |
| 2001/0028977 A1* | 10/2001 | Kazacos | B60L 11/1879 429/105 |
| 2005/0159086 A1* | 7/2005 | Sinha | H01L 21/3212 451/41 |
| 2006/0257638 A1 | 11/2006 | Glatkowski et al. | |
| 2008/0035882 A1* | 2/2008 | Zhao | B24B 37/044 252/79.4 |
| 2008/0210660 A1 | 9/2008 | Stockum et al. | |
| 2008/0286447 A1 | 11/2008 | Alden et al. | |
| 2009/0246957 A1* | 10/2009 | Kamimura | C09G 1/02 438/693 |
| 2010/0248480 A1* | 9/2010 | Darsillo | C09G 1/02 438/693 |
| 2010/0283050 A1* | 11/2010 | Lee | H01L 29/7869 257/43 |
| 2011/0226694 A1* | 9/2011 | Martin | C22B 3/0043 210/638 |
| 2012/0141736 A1 | 6/2012 | Hotta et al. | |
| 2012/0177920 A1 | 7/2012 | Huang | |
| 2012/0252214 A1* | 10/2012 | Kamimura | C09G 1/02 438/693 |
| 2013/0044049 A1 | 2/2013 | Biggs et al. | |
| 2013/0088779 A1 | 4/2013 | Kang et al. | |
| 2013/0095237 A1 | 4/2013 | Kalyankar et al. | |
| 2013/0157008 A1 | 6/2013 | Aytug et al. | |
| 2013/0164545 A1 | 6/2013 | Evans et al. | |
| 2013/0230733 A1 | 9/2013 | Nakamura et al. | |
| 2013/0250414 A1 | 9/2013 | Eguchi et al. | |
| 2013/0286478 A1 | 10/2013 | Furui et al. | |
| 2014/0009834 A1 | 1/2014 | Kalyankar | |
| 2014/0021400 A1* | 1/2014 | Coenjarts | C03C 15/00 252/79.4 |
| 2014/0023840 A1 | 1/2014 | Shibayama et al. | |
| 2014/0030488 A1 | 1/2014 | Jung et al. | |
| 2014/0038109 A1 | 2/2014 | Rahman et al. | |
| 2014/0051804 A1 | 2/2014 | Xiaobing et al. | |
| 2014/0338735 A1 | 11/2014 | Allemand | |
| 2015/0027978 A1* | 1/2015 | Barnes | C09K 13/00 216/13 |
| 2015/0277616 A1 | 10/2015 | Wang | |
| 2016/0032186 A1* | 2/2016 | Chen | C23G 1/02 252/79.3 |
| 2016/0041657 A1 | 2/2016 | Wang | |

OTHER PUBLICATIONS

Walker, Geoff "Fundamentals of Touch Technologies" SID Display Week 2013, Oct. 2013, version 1.3. Printed Mar. 8, 2014. 247 pages. http://www.walkermobile.com/Touch_Technologies_Tutorial_Latest_Version.pdf.

Walker, Geoff "Fundamentals of Touch Technologies" SID Display Week 2014, Jun. 1, 2014, version 1.2. Printed Jun. 23, 2014. 315 pages. http://www.walkermobile.com/Touch_Technologies_Tutorial_Latest_Version.pdf.

Davis, Trevor "Reducing Capacitive Touchscreen Cost in Mobile Phones" Embedded, Feb. 25, 2013. Printed Mar. 14, 2014. Five(5) printed pages. http://staging.embedded.com/design/system-integration/4407698/Reducing-capacitive-touchscreen-cost-in-mobile-phones-.

Hong, Sukjoon "Selective Laser Direct Patterning of Silver Nanowire Percolation Network Transparent Conductor or Capacitive Touch Panel" J. Nanosci. Nanotechnol. 15, 2317-2323 (2015).

Office Action from U.S. Appl. No. 14/667,688, dated Jun. 15, 2017.
Office Action from U.S. Appl. No. 14/922,368, dated Apr. 21, 2017.

* cited by examiner

Line width is about 0.2 mm.

Line width is about 0.15 mm.

Line width is about 0.10mm.

Line width is about 0.05 mm.

… (US 10,294,422 B2)

ETCHING COMPOSITIONS FOR TRANSPARENT CONDUCTIVE LAYERS COMPRISING SILVER NANOWIRES

CROSS-REFERENCE TO RELATED APPLICATIONS

This application is based upon and claims priority to the U.S. provisional patent application No. 62/193,218, entitled "Etching Compositions for Transparent Conductive Layers Comprising Silver Nanowires," filed Jul. 16, 2015. The entire content of this patent application is incorporated herein by reference.

BACKGROUND

Technical Field

This invention in general relates to a transparent conductive layer comprising a silver nanowire. This invention further relates to an etching composition suitable for etching a transparent conductive layer comprising a silver nanowire to form a pattern. This invention further relates to a transparent conductive electrode manufactured by etching a transparent conductive film comprising a silver nanowire.

Description of Related Art

Transparent conductive films may be patterned to produce transparent conductive electrodes that can be used in manufacturing of variety of electronic devices such as touch sensors, LCD displays, electrochromic displays, and LED displays.

Such patterning may be achieved by etching. Current etching methods may include physical and wet chemical etching. The physical methods are based on the selective energy absorption and evaporation of material etched. Examples of the physical etching include laser and plasma etching. The wet etching is based on a selective reaction of an etchant with the material that is to be etched, forming a soluble compound that can be easily removed.

Examples of the wet etching are related to photolithographic or printing methods. The printing methods include silk screen printing and inkjet printing. A general description of the etching methods may be found in e.g. Jaeger "Lithography Introduction to Microelectronic Fabrication," $2^{nd}$ ed. (2002) Upper Saddle River, Prentice Hall; and Kohler "Etching in Microsystem Technology," (1999) John Wiley & Son Ltd. The entire content of each of these publications is incorporated herein in by reference.

For etching of transparent conductive films deposited on PET films, see, for example, Stockum et. al. "Medium for etching oxidic, transparent, conductive layers" U.S. patent application publication no. 2008/0210660; Allemand et al. "Nanowire-based transparent conductors and applications thereof" U.S. patent application publication no. 2014/0338735; and Coenjarts "Printable etchant compositions for etching silver nanowire-based transparent, conductive film" U.S. patent application publication no. US2014/0021400. The entire content of each of these publications is incorporated herein by reference.

SUMMARY

This invention in general relates to a transparent conductive layer comprising a silver nanowire. This invention further relates to an etching composition suitable for etching a transparent conductive layer comprising a silver nanowire to form a pattern. This invention further relates to a transparent conductive electrode manufactured by etching a transparent conductive film comprising a silver nanowire.

This invention relates to an etching composition suitable for etching a silver nanowire incorporated in a transparent conductive nanocomposite layer. This composition may comprise at least one oxidizing agent and at least one ligand. The at least one oxidizing agent may be a first chemical compound that can react with silver to form a silver compound. The at least one ligand may be a second chemical compound that can react with the silver compound to form a water soluble coordination complex of silver ion. The silver nanowire may comprise the silver with which the oxidizing agent can react.

The at least one oxidizing agent may comprise an iron (III) salt, a copper (II) salt, or any combination thereof. The at least one oxidizing agent may comprise iron(III) chloride, $FeCl_3$; iron (III) sulfate, $Fe_2(SO_4)_3$; iron(III) sulfamate, $Fe(SO_3NH_2)_3$; iron mesylate, $Fe(SO_3CH_3)_3$; copper (II) chloride, $CuCl_2$; $KMnO_4$, or any combination thereof. The at least one ligand may comprise acetic acid, lactic acid, succinimide, 5,5 dimethyl hydantoin, a buffer solution, or any combination thereof. The at least one oxidizing agent may comprise iron(III) chloride, $FeCl_3$; iron (III) sulfate, $Fe_2(SO_4)_3$; iron(III) sulfamate, $Fe(SO_3NH_2)_3$; iron mesylate, $Fe(SO_3CH_3)_3$; copper (II) chloride, $CuCl_2$; $KMnO_4$; or any combination thereof; and the ligand may comprise acetic acid, lactic acid, succinimide, 5,5 dimethyl hydantoin, a buffer solution, or any combination thereof.

The at least one ligand may comprise a buffer solution; and wherein the buffer may comprise an acid and its salt. The at least one ligand may comprise a buffer solution; and wherein the buffer solution may comprise acetic acid and sodium acetate; or acetic acid and potassium acetate; or lactic acid and sodium lactate; or lactic acid and potassium lactate; or any combination thereof.

The at least one oxidizing agent may comprise $FeCl_3$. The at least one oxidizing agent may comprise $FeCl_3$ and the at least one ligand may comprise acetic acid, lactic acid, succinimide, or any combination thereof.

The at least one oxidizing agent may comprise $FeCl_3$ and the ligand may comprise acetic acid. The at least one oxidizing agent may comprise $FeCl_3$ and the at least one ligand may comprise lactic acid.

The at least one oxidizing agent may comprise $FeCl_3$ and the at least one ligand may comprise succinimide. The at least one oxidizing agent may comprise $FeCl_3$, and the at least one ligand may comprise acetic acid and lactic acid.

The at least one oxidizing agent may comprise $FeCl_3$, and the at least one ligand may comprise acetic acid and succinimide. The at least one oxidizing agent may comprise $FeCl_3$ and the at least one ligand may comprise lactic acid and succinimide. The at least one oxidizing agent may comprise $FeCl_3$, and the at least one ligand may comprise acetic acid, lactic acid, and succinimide.

The at least one oxidizing agent may comprise $Fe_2(SO_4)_3$. The at least one oxidizing agent may comprise $Fe_2(SO_4)_3$ and the at least one ligand may comprise acetic acid, lactic acid, succinimide, or any combination thereof. The at least one oxidizing agent may comprise $Fe_2(SO_4)_3$ and the at least one ligand may comprise acetic acid. The at least one oxidizing agent may comprise $Fe_2(SO_4)_3$ and the at least one ligand may comprise lactic acid.

The at least one oxidizing agent may comprise $Fe_2(SO_4)_3$ and the at least one ligand may comprise succinimide. The at least one oxidizing agent may comprise $Fe_2(SO_4)_3$, and the at least one ligand may comprise acetic acid and lactic acid. The at least one oxidizing agent may comprise $Fe_2(SO_4)_3$, and the at least one ligand may comprise acetic acid and succinimide.

The at least one oxidizing agent may comprise $Fe_2(SO_4)_3$, and the at least one ligand may comprise lactic acid and succinimide. The at least one oxidizing agent may comprise $Fe_2(SO_4)_3$, and the at least one ligand may comprise acetic acid, lactic acid, and succinimide.

The at least one oxidizing agent may comprise Iron(III) sulfamate, $Fe(SO_3NH_2)_3$. The at least one oxidizing agent may comprise Iron(III) sulfamate, $Fe(SO_3NH_2)_3$ and the at least one ligand may comprise acetic acid, lactic acid, succinimide, or any combination thereof. The at least one oxidizing agent may comprise $Fe(SO_3NH_2)_3$ and the at least one ligand may comprise acetic acid.

The at least one oxidizing agent may comprise $Fe(SO_3NH_2)_3$ and the at least one ligand may comprise lactic acid. The at least one oxidizing agent may comprise $Fe(SO_3NH_2)_3$ and the at least one ligand may comprise succinimide. The at least one oxidizing agent may comprise $Fe(SO_3NH_2)_3$, and the at least one ligand may comprise acetic acid and lactic acid.

The at least one oxidizing agent may comprise $Fe(SO_3NH_2)_3$, and the at least one ligand may comprise acetic acid and succinimide. The at least one oxidizing agent may comprise $Fe(SO_3NH_2)_3$, and the at least one ligand may comprise lactic acid and succinimide. The at least one oxidizing agent may comprise $Fe(SO_3NH_2)_3$, and the at least one ligand may comprise acetic acid, lactic acid, and succinimide.

The at least one oxidizing agent may comprise iron mesylate, $Fe(SO_3CH_3)_3$. The at least one oxidizing agent may comprise iron mesylate, $Fe(SO_3CH_3)_3$ and the at least one ligand comprise acetic acid, lactic acid, succinimide, or any combination thereof. The at least one oxidizing agent may comprise $Fe(SO_3CH_3)_3$ and the at least one ligand may comprise acetic acid.

The at least one oxidizing agent may comprise $Fe(SO_3CH_3)_3$ and the at least one ligand may comprise lactic acid. The at least one oxidizing agent may comprise $Fe(SO_3CH_3)_3$ and the at least one ligand may comprise succinimide. The at least one oxidizing agent may comprise $Fe(SO_3CH_3)_3$, and the at least one ligand may comprise acetic acid and lactic acid.

The at least one oxidizing agent may comprise $Fe(SO_3CH_3)_3$, and the at least one ligand may comprise acetic acid and succinimide. The at least one oxidizing agent may comprise $Fe(SO_3CH_3)_3$, and the at least one ligand may comprise lactic acid and succinimide. The at least one oxidizing agent may comprise $Fe(SO_3CH_3)_3$, and the at least one ligand may comprise acetic acid, lactic acid, and succinimide.

The at least one oxidizing agent may comprise $KMnO_4$, and the at least one ligand may comprise acetic acid, and the etching composition may further comprise water. The at least one oxidizing agent may comprise $KMnO_4$, and the at least one ligand may comprise acetic acid, sodium acetate, and the etching composition may further comprise water. The at least one oxidizing agent may comprise $KMnO_4$, and the at least one ligand may comprise acetic acid, potassium acetate, and the etching composition may further comprise water.

The composition may further comprise a solvent. The solvent may comprise water, an organic solvent, or any combination thereof. The composition may further comprise water. The etching composition may further comprise an organic solvent. The etching composition may further comprise an alcohol, a glycol, or any combination thereof. The glycol may comprise ethylene glycol, polyethylene glycol, polypropylene glycol, ethylene glycol monomethyl ether, ethylene glycol monoethyl ether, propylene glycol monomethyl ether, propylene glycol monoethyl ether, methyl ethyl ketone, or any combination thereof.

The etching composition may further comprise a thickening agent. The thickening agent may comprise a cellulose derivative, a starch, a starch derivative, xanthan, polyvinylpyrrolidone, polyethylene glycol, a nanoparticle, or any combination thereof. The thickening agent may comprise a cellulose derivative. The cellulose derivative may comprise a water soluble cellulose derivative.

The etching composition may further comprise a nanoparticle. The nanoparticle may comprise silica, titanium dioxide, a nanoclay, or any combination thereof.

The etching composition may further comprise an additive. The additive may comprise an antifoaming agent, a thixotropic agent, a flow control agent, a deaerating agent, an adhesion promoter, or any combination thereof.

The etching composition may comprise $FeCl_3$, succinimide, lactic acid, and a thickener. The etching composition may comprise iron (III) sulfate $Fe_2(SO_4)_3$, succinimide, lactic acid, and a thickener. The etching composition may comprise iron(III) sulfamate $Fe(SO_3NH_2)_3$, succinimide, lactic acid, and a thickener. The etching composition may comprise iron mesylate $Fe(SO_3CH_3)_3$, succinimide, lactic acid, and a thickener.

The concentration of the at least one ligand may be in the range of 0.001% by weight to 20% by weight. The concentration of the at least one ligand may be in the range of 0.1% by weight to 10% by weight.

The concentration of the at least one oxidizing agent may be in the range of 0.001% by weight to 20% by weight. The concentration of the oxidizing agent may be in the range of 0.1% by weight to 10% by weight.

The etching composition may further comprise water. The concentration of water may be in the range of 50% by weight to 99% by weight. The concentration of water may be in the range of 80% by weight to 99% by weight. The concentration of water may be in the range of 0.1% by weight to 90% by weight. The concentration of water may be in the range of 0.1% by weight to 20% by weight.

Any combination of above compositions and/or chemical compounds is within the scope of the instant disclosure.

These, as well as other components, steps, features, objects, benefits, and advantages, will now become clear from a review of the following detailed description of illustrative embodiments, the accompanying drawings, and the features.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

In this disclosure, the following reference numbers are used for the features disclosed: transparent conductive electrode 101, conductive nanocomposite layer 102, front surface of the conductive nanocomposite layer 102.1, back surface of the conductive nanocomposite layer 102.2, lamination layer 103, transparent substrate 104, front surface of the transparent substrate 104.1, back surface of the transparent substrate 104.2, polyimide masking tape 105, photoresist 106, silk screen 107, electrically conductive area 108, and etched area 109. In this disclosure, the following reference numbers and letters are used for the processes disclosed: application of the masking tape 1A, measurement of the electrical resistance $R_0$ 1B, application of the etching composition 1C, measurement of the electrical resistance $R_t$ 1D, application of the photoresist 2A, application of photomask and then UV exposure 2B, development 2C, etching 2D, removal of the photoresist 2E, placement of the silk screen 3A, printing of the etching paste and removal of the silk screen 3B, and etching and washing 3C.

DETAILED DESCRIPTION OF ILLUSTRATIVE EMBODIMENTS

Figure 1:
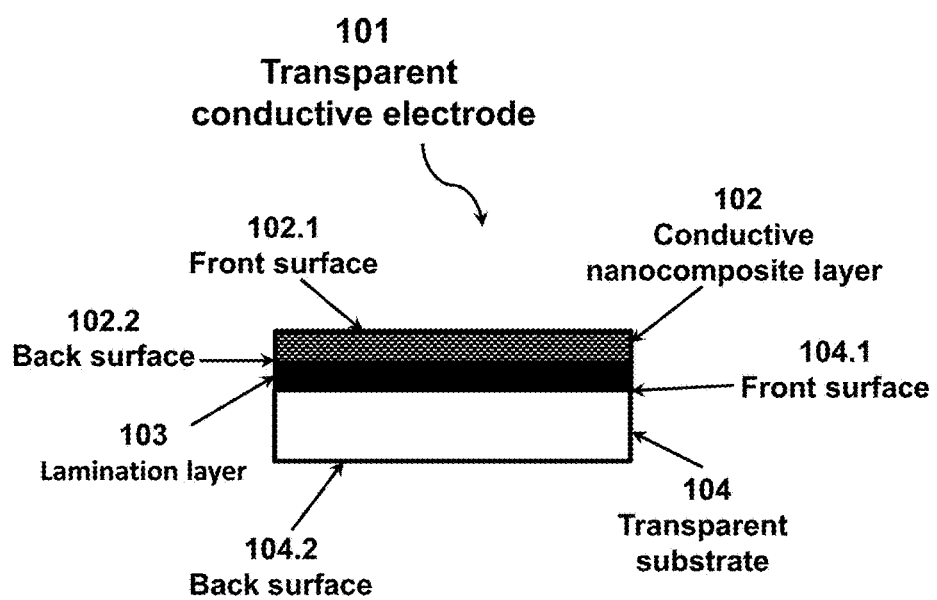
FIG. 1 illustrates a transparent conductive electrode comprising a conductive nano-composite layer, a lamination layer, and a transparent substrate.

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

In this disclosure, the word "form" may mean "deposit", "coat", "dispose", "laminate", "apply", "place", "provide", "position", "manufacture," or the like. In this disclosure, the phrase "any combination thereof" or "a combination thereof" may mean "any mixture thereof," "any composite thereof," "any alloy thereof," or the like. In this disclosure, the indefinite article "a" and phrases "one or more" and "at least one" are synonymous and mean "at least one".

This invention in general relates to a transparent conductive layer comprising a silver nanowire. This invention further relates to an etching composition suitable for etching a transparent conductive layer comprising a silver nanowire to form a pattern. This invention further relates to a transparent conductive electrode manufactured by etching a transparent conductive film comprising a silver nanowire.

The present disclosure relates to a U.S. Patent Application to Hailiang Wang, entitled "Systems and Methods for Touch Sensors on Polymer Lenses", U.S. patent application Ser. No. 14/224,838; filed Mar. 25, 2014. The present disclosure also relates to a U.S. Patent Application to Hailiang Wang, entitled "Systems and High Throughput Methods for Touch Sensors", U.S. patent application Ser. No. 14/667,688; filed Mar. 25, 2015. The present disclosure also relates to a U.S. provisional patent application No. 62/196,930, entitled "Transferable Nanocomposites for Touch Sensors," filed Jul. 25, 2015. The entire content of each of these patent applications is incorporated herein by reference.

The present disclosure also generally relates to optoelectronic systems including touch screens and displays, particularly to systems such as liquid-crystal displays (LCD), light emitting displays (LED), organic light emitting displays (OLED), polymer light emitting displays (PLED), plasma displays, electrochromic displays, and the like, which may comprise the touch sensors. The electronic system of current disclosure also relates to electrophoretic displays, electrowetting displays, electrofluidic displays and other bistable displays such as those incorporated into e-paper, Kindle readers, and the like, which may comprise the touch sensors.

The present disclosure relates to a composition suitable for etching a coating (e.g. layer) comprising a silver nanowire ("etching composition"). The etching composition may comprise an oxidizing agent and a ligand.

The etching composition may comprise more than one chemical compound. The oxidizing agent may be a first chemical compound of the etching composition. The oxidizing agent may react with silver metal to form a silver compound. The oxidizing agent may be any agent that can selectively react with silver metal and convert it into silver ion. The oxidizing agent may be any agent that is compatible with any other component(s) of the etching composition. The oxidizing agent may be an organic compound, an inorganic compound, or any combination thereof. The oxidizing agent may be an ion, an anion, or any combination thereof. The oxidizing agent may comprise an iron (III) salt, copper (II) salt, or any combination thereof. Examples of the iron salt may be iron(III) chloride $FeCl_3$, iron (III) sulfate $Fe_2(SO_4)_3$, iron(III) sulfamate $Fe(SO_3NH_2)_3$, iron mesylate $Fe(SO_3CH_3)_3$, copper (II) chloride $CuCl_2$, $KMnO_4$, or any combination thereof. Concentration of the oxidizing agent may be in the range of 0.001% by weight to 20% by weight.

The oxidizing agent concentration may be in the range of 0.01% by weight to 10% by weight.

The ligand may be a second chemical compound of the etching composition. The ligand may react with the silver compound to form a water soluble coordination complex of the silver ion. The ligand may be an organic compound, an organic anion, or any combination thereof. The ligand may form a coordination complex with silver ion. Examples of the ligand may be an acetate, a lactate, a sulfamate, a mesylate, succinimide, dimethyl hydantoin, or any combination thereof. Examples of the ligand may be a lactate, succinimide, dimethy hydantoin, or any combination thereof. Examples of the ligand may be acetic acid, lactic acid, succinimide, 5,5 dimethyl hydantoin, or any combination thereof. Said ligands may form a water soluble coordination complex with silver ion. Such compounds that form coordination complexes with silver ion may be nontoxic. The coordination complexes thereby formed may also be nontoxic. Concentration of the ligand in the etching composition may be in the range of 0.01% by weight to 20% by weight. The ligand concentration may be in the range of 0.1% by weight to 10% by weight.

The etching composition may further comprise a solvent. Examples of the solvent may be water, an organic solvent, or any combination thereof.

In one example, the solvent may be water. In this example, the etching composition may be produced by dissolving the oxidizing agent and the ligand in water to form a homogenous aqueous solution. Such etching compositions may be used in a photolithography process. The etching composition may be applied on a transparent conductive film or layer by using a spray or a dipping process, followed by washing with water. For the photolithography process, concentration of water in the etching composition may be in the range of 50% by weight to 99% by weight, or in the range of 80% by weight to 99% by weight. The etching composition may be applied on a transparent conductive film by using a screen printing process or an inkjet printing process. For such processes, the etching composition may be in the form of a paste. In such pastes, the water concentration of the etching composition may be in the range of 0.1% by weight to 50% by weight, or in the range of 0.1% by weight to 20% by weight.

For example, the solvent may be an organic solvent. Examples of the organic solvent may be alcohols, glycols, and any combination thereof. Examples of glycols may be polyethylene glycol, polypropylene glycol, ethylene glycol monomethyl ether, ethylene glycol monoethyl ether, propylene glycol monomethyl ether, propylene glycol monoethyl ether, methyl ethyl ketone, or any combination thereof.

The etching composition may further comprise a thickener, a paste, ink, or any combination thereof. The thickener may comprise a thixotropic compound that forms a thixotropic paste when added to the etching composition. The paste may have a non-Newtonian flow behavior. Such paste may be suitable for a silk screen printing or an inkjet printing of the etching composition on the transparent electrically conductive nanocomposite layer.

The thickener may comprise a water soluble cellulose derivative, a water soluble polymer, a nanoparticle, or any combination thereof. Examples of water soluble polymers are polyethylene glycol, polyvinylpyrrolidone, polyvinyl alcohol, or any combination thereof. Examples of nanoparticles are silica nanoparticles, titania nanoparticles, nanoclay, or any combination thereof.

The etching composition may further comprise a colorant, an anti-foaming agent, or any combination thereof.

Examples of the etching composition are as follows. The etching composition may comprise $FeCl_3$. The etching composition may comprise $FeCl_3$ and acetic acid. The etching composition may comprise $FeCl_3$ and lactic acid. The etching composition may comprise $FeCl_3$ and succinimide. The etching composition may comprise $FeCl_3$, acetic acid, and lactic acid. The etching composition may comprise $FeCl_3$, acetic acid, and succinimide. The etching composition may comprise $FeCl_3$, acetic acid, lactic acid, and succinimide.

Other examples of the etching composition are as follows. The etching composition may comprise $Fe_2(SO_4)_3$. The etching composition may comprise $Fe_2(SO_4)_3$ and acetic acid. The etching composition may comprise $Fe_2(SO_4)_3$ and lactic acid. The etching composition may comprise $Fe_2(SO_4)_3$ and succinimide. The etching composition may comprise $Fe_2(SO_4)_3$, acetic acid, and lactic acid. The etching composition may comprise $Fe_2(SO_4)_3$, acetic acid, and succinimide. The etching composition may comprise $Fe_2(SO_4)_3$, lactic acid, and succinimide. The etching composition may comprise $Fe_2(SO_4)_3$, acetic acid, lactic acid, and succinimide.

Other examples of the etching composition are as follows. The etching composition may comprise Iron(III) sulfamate $Fe(SO_3NH_2)_3$. The etching composition may comprise $Fe(SO_3NH_2)_3$ and acetic acid. The etching composition may comprise $Fe(SO_3NH_2)_3$ and lactic acid. The etching composition may comprise $Fe(SO_3NH_2)_3$ and succinimide. The etching composition may comprise $Fe(SO_3NH_2)_3$, acetic acid, and lactic acid. The etching composition may comprise $Fe(SO_3NH_2)_3$, acetic acid, and succinimide. The etching composition may comprise $Fe(SO_3NH_2)_3$, lactic acid, and succinimide. The etching composition may comprise $Fe(SO_3NH_2)_3$, acetic acid, lactic acid, and succinimide.

Other examples of the etching composition are as follows. The etching composition may comprise Iron(III) mesylate $Fe(SO_3CH_3)_3$. The etching composition may comprise $Fe(SO_3CH_3)_3$ and acetic acid. The etching composition may comprise $Fe(SO_3CH_3)_3$ and lactic acid. The etching composition may comprise $Fe(SO_3CH_3)_3$ and succinimide. The etching composition may comprise $Fe(SO_3CH_3)_3$, acetic acid, and lactic acid. The etching composition may comprise $Fe(SO_3CH_3)_3$, acetic acid, and succinimide. The etching composition may comprise $Fe(SO_3CH_3)_3$, lactic acid, and succinimide. The etching composition may comprise $Fe(SO_3CH_3)_3$, acetic acid, lactic acid, and succinimide.

Other examples of the etching composition are as follows. The etching composition may comprise $KMnO_4$ and acetic acid. The etching composition may comprise $KMnO_4$, acetic acid, and sodium acetate. The etching composition may comprise $KMnO_4$, acetic acid, and potassium acetate.

Following exemplary reactions may happen during the etching process. In this example, an oxidizing agent, iron (III) chloride present in the etching composition reacts with silver metal present in the transparent electrically conductive nanocomposite layer. This reaction forms silver chloride and iron (II) chloride. A ligand present in the etching composition reacts with silver chloride to form a water soluble coordination complex of silver ion. The reactions may proceed as follows:

$$Ag + FeCl_3 \rightarrow AgCl + FeCl_2 \qquad (1)$$

$$AgCl + nL \rightarrow Ag(L)_nCl \qquad (2)$$

Where n=1, 2, 3 . . . n. In order to have the reaction (1) to be spontaneous, Gibbs free energy change $\Delta G°$ may need to be negative, in accordance with the following equation:

$$\Delta G° = -nFE° \qquad (3)$$

E° may need to be positive, where:

$$E° = E°_{cathode} - E°_{anode} \quad (4)$$

The standard electrode potential for half reaction of equation (1) is $$AgCl(s) + e^- \rightarrow Ag(s) + Cl^- \quad E°_{anode} = +0.22233 \quad (5)$$

$$Fe^{3+} + e^- \rightarrow Fe^{2+} \quad E°_{cathode} = +0.77V \quad (6)$$

$$E° = 0.77 - 0.22233 = 0.54767 > 0 \quad (7)$$

Thus the reaction may be spontaneous.

However, silver chloride formed from etching reaction may be insoluble in water and may thereby deposit on the transparent electronically conductive nanocomposite layer. Such deposition may damage the electronic device. Furthermore, such deposits may be very difficult to remove, for example, by simple washing using a solvent such as water.

The solubility of silver chloride in etching composition may depend on equilibrium constant Kc of chemical equilibrium as shown in the following equations:

$$K_c = K_{sp} \times K_f \quad (8)$$

where $K_{sp}$ is a solubility product of silver chloride:

$$AgCl \rightarrow Ag^+ + Cl^- \quad (9)$$

$K_{sp} = [Ag^+][Cl^-] = 1.77 \times 10^{-10}$ mol$^2$ dm$^{-6}$ at 25° C.

And $K_f$ is stability constant of silver ion coordination complex $[AgL_n]^+$ $$Ag^+ + nL \rightarrow [AgL_n]^+ \quad K_f = [AgL_n]/[Ag^+][L]^n \quad (10)$$

Organic compounds, for example, acetic acid, lactic acid, succinimide, dimethyl hydantoin, or any combination thereof may act as a ligand, L to form a water soluble coordination complex with silver ion. When combined with iron (III) chloride, such ligands may effectively etch silver nanowire, and prevent deposition of the solid reaction products on a transparent electrically conductive nanocomposite layer. An etching pattern may thereby be developed after a simple water washing of the etched layer.

Example 1. Preparation of Silver Nanowire Nano-Composite on PET Film

A transparent conductive electrode 101 shown in FIG. 1 was prepared by following a method disclosed in the U.S. Patent Application to Hailiang Wang, entitled "Systems and High Throughput Methods for Touch Sensors," U.S. patent application Ser. No. 14/667,688; filed Mar. 25, 2015. Entire content of this patent application is incorporated herein by reference. The conductive nanocomposite layer 102 comprised silver nanowires. The transparent substrate 104 was a PET film.

A silver nanowire dispersion of about 0.47 wt % in isopropanol was coated on a high thermal stability PET film (used as a protective PET film) by Meyer Rod #10. The wet coating was dried in a regular oven at about 150 centigrade for about 5 minutes to form Component A.

Another highly transparent PET film (used as a transparent substrate) was coated with a lamination formulation to form Component B, as described in U.S. patent application Ser. No. 14/667,688. The lamination formulation comprised a monoacrylate, a diacrylate, a triacrylate, and a catalyst. After a UV curing, this lamination liquid formulation formed both lamination layer and polymer matrix in silver nanowire nanocomposite.

Figure 2:
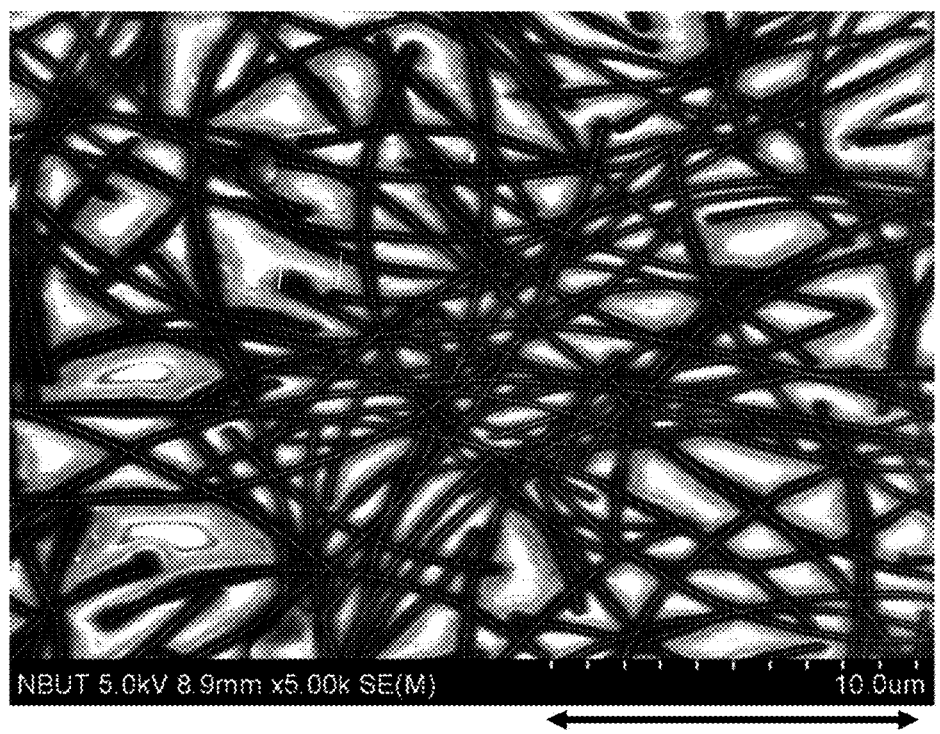
FIG. 2 shows a microscopic photograph of the silver nanowires formed on the front surface of the conductive nano-composite layer. Darker objects on the photograph are the silver nanowires. The width shown by black arrow is about 10 micrometers.

Component A and Component B were combined with a wet lamination layer. Any trapped air and excess lamination liquid was driven off by applying a uniform pressure using a roller. The assembly was passed through a UV curing conveyor system at about 3 ft/min. After peeling off the high thermal stability PET film (protective PET film), the silver nanowire nanocomposite layer on the high transparent PET film (transparent substrate) was obtained as the transparent conductive electrode 101. The sheet resistance of the transparent conductive nano-composite layer 102 was about 33 ohm/square. The transmittance of the transparent conductive electrode 101 was about 88.73% at about 550 nm. The surface morphology of the front surface of the conductive nano-composite layer 102 is shown in FIG. 2.

Example 2. Method of Evaluating Etching Power of an Etching Composition

Figure 3:
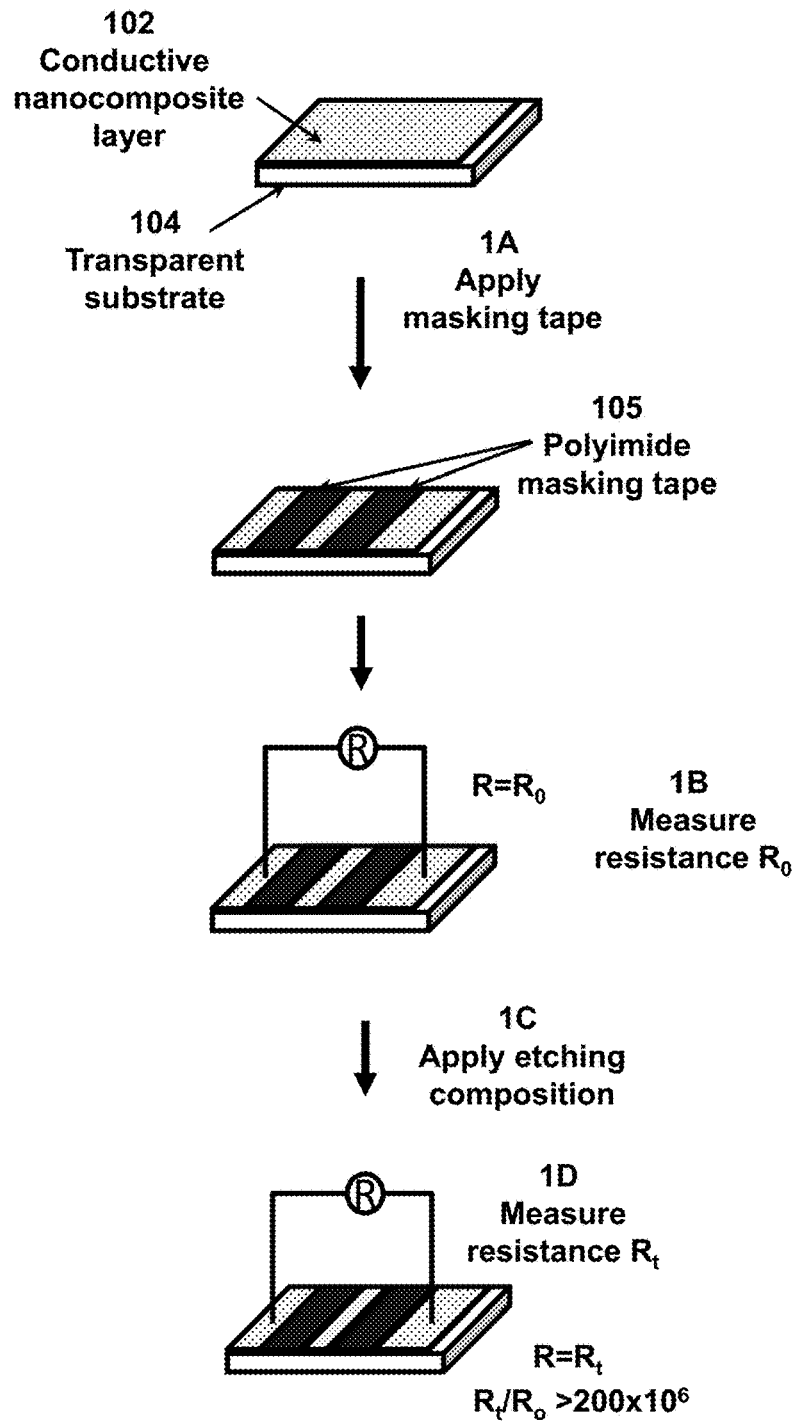
FIG. 3 illustrates a method used in to determine progress of etching.

In this method, first, two strips of polyimide film tape were adhered on the front surface of the conductive nano-composite layer 102, as shown in FIG. 3. The gap between the two strips was about 2 mm wide. The electric resistance was measured and recorded as $R_0$. An etching composition comprising an aqueous solution (for photolithography) or a paste for silk screen printing was applied on the area formed by the gap between the two polyimide strips. The electric resistance was monitored with time $R_t$ until the $R_t/R_0$ value reached about 200×10$^6$. The etching area was washed with water and air dried. Then, the electric resistance was re-measured to confirm the result.

Figure 4:
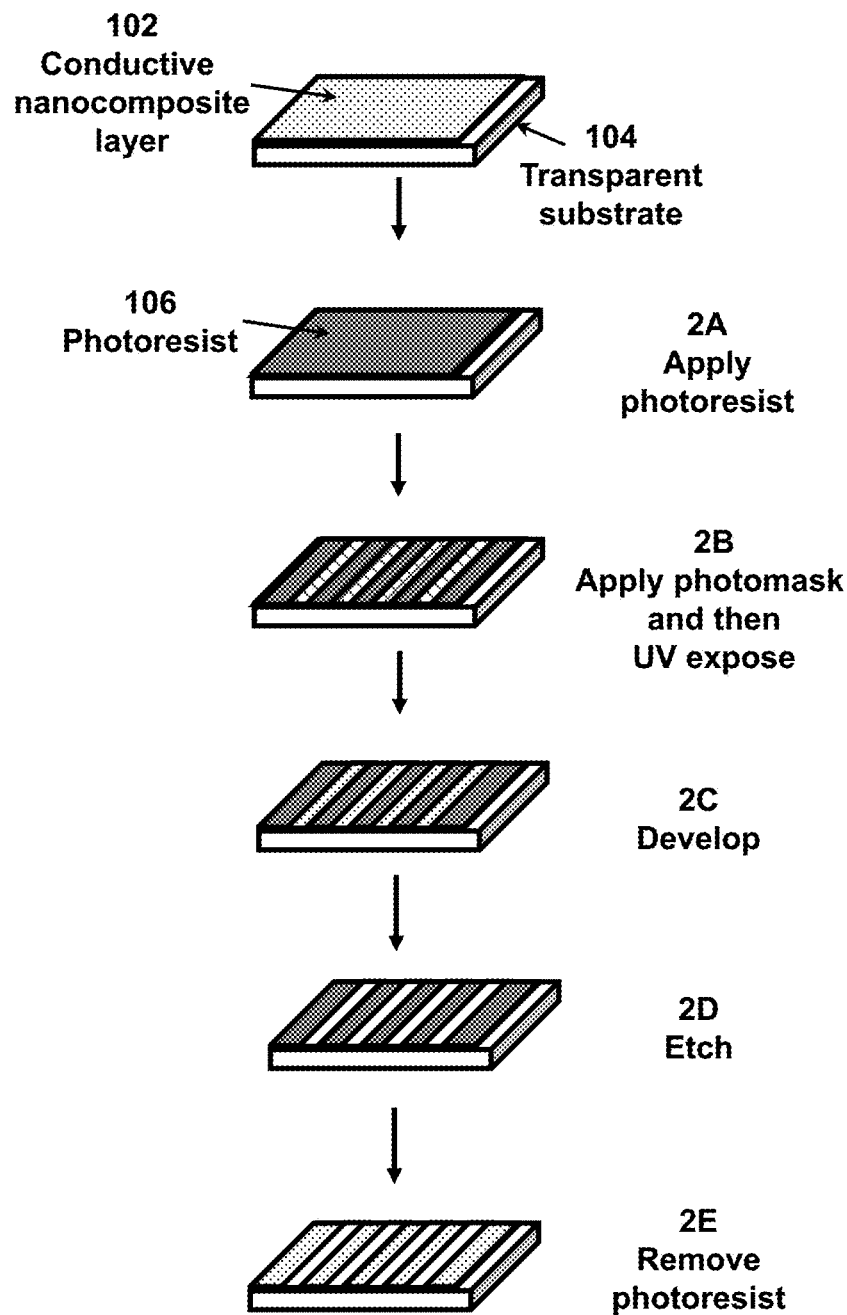
FIG. 4 illustrates formation of line patterns by using a photolithography process.

Example 3. A General Photolithography Etching Process of Silver Nanowire Nanocomposite A general photolithography etching process for the silver nanowire nano-composite layer 102 is shown in FIG. 4. A liquid or a film of a photoresist was first applied on the front surface of the silver nanowire composite layer. After exposure to a UV radiation through a photomask and development, a pattern was formed where area to be etched was exposed. An etching composition was then applied by using a spray coating technique or by dipping the device in a tank filled with the etching composition for a predetermined period of time. Through steps of washing and removing of the photoresist, an etched pattern was formed on nano-composite layer comprising silver nanowire.

Example 4. Photolithography Etching Composition

All chemicals including oxidizing agent KMnO$_4$, FeCl$_3$, acetic acid, sodium acetate, lactic acid, malic acid(hydrozybutanedioic acid), citric acid (2-hydroxypropane-1,2,3-tricarboxylic acid), succinimide were purchased from Aladdin Industrial Corporation, China. Solvents, ethylene glycol, polyethylene glycol, ethylene glycol monomethyl ether, and propylene glycol dimethyl ether, were purchased from Sinopharm Chemical Reagent Co. Ltd. Following table summarizes exemplary compositions used for photolithography etching of the silver nanowire nanocomposite layer 102.

| Example | Oxidizer (wt %) | Ligand (wt %) | Solvent (wt %) | Etching time (min) |
|---------|-----------------|---------------|----------------|--------------------|
| 4-1 | KMnO$_4$ (0.1) | Acetic acid (1.24) | Water (98.7) | 1 |

-continued

| Example | Oxidizer (wt %) | Ligand (wt %) | Solvent (wt %) | Etching time (min) |
|---|---|---|---|---|
| 4-2 | KMnO$_4$ (0.005) | Acetic acid (0.011) | Water (98.9) | 2 |
| 4-3 | KMnO$_4$ (0.1) | Acetic acid (1.76) Sodium acetate (1.76) | Water (96.38) | 5 |
| 4-4 | KMnO$_4$ (0.1) | Succinimde (1.18) | Water (98.72) | 5 |
| 4-5 | KMnO$_4$ (0.97) | Succinimide (1.11) Acetic acid (1.65) | Water (96.28) | 5 |
| 4-6 | FeCl$_3$ (1.16) | Lactic acid (1.00) | Water (97.84) | 0.5 |
| 4-7 | FeCl$_3$ (1.00) | Succinimide (0.98) | Water (98.02) | 2 |
| 4-8 | FeCl$_3$ (1.10) | Succinimide (1.00) acetic acid (1.18) | Water (96.72) | 0.5 |
| 4-9 | FeCl$_3$ (0.93) | Acetic acid (1.00) Sodium acetate (1.00) | Water (97.07) | 0.5 |

Example 5. Comparative Examples

Etching compositions in this example were not found suitable for etching of the conductive silver nano-composite layer. That is, no or negligible etching was observed for these compositions, or etching compositions were not stable. The results are summarized in the following table. The evaluation is carried out following the method described in Example 2. In Examples 5-1 through 5-3, the oxidizer KMnO$_4$ was not compatible with the ligand lactic acid, malic acid, and citric acid. In Examples 5-4 and 5-5, KMnO$_4$ was not compatible with the solvent ethylene glycol mono ethyl ether or propylene mono methyl ether.

| Example | Oxidizer (wt %) | Ligand (wt %) | Solvent (wt %) | Etching time |
|---|---|---|---|---|
| 5-1 | KMnO$_4$ (0.10) | Lactic acid (1.17) | Water (98.73) | No etching |
| 5-2 | KMnO$_4$ (0.10) | Malic acid (1.03) | Water (98.87) | No Etching |
| 5-3 | KMnO$_4$ (0.10) | Citric acid (1.22) | Water (98.68) | No etching |
| 5-4 | KMnO$_4$ (0.10) | Acetic acid (1.0) Sodium acetate (1.0) | Water (97) Ethylene glycol monoethyl ether (1) | No etching |
| 5-5 | KMnO$_4$ (0.1) | | Water (1) propylene glycol monomethyl ether (98) | No etching |

Example 6. Etching by Using a Silk Screen Printing Process

Figure 5:
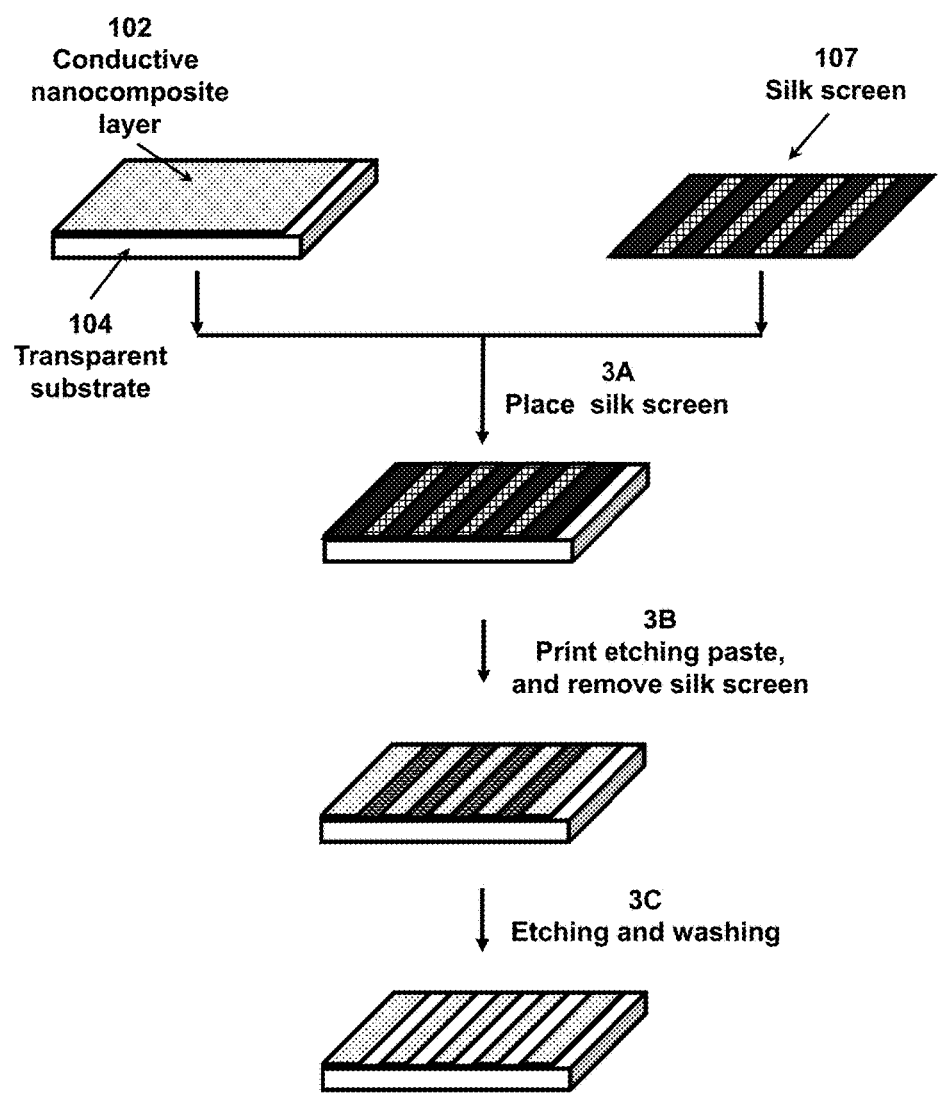
FIG. 5 illustrates formation of line patterns by using a silk-screen process.
Figure 6:
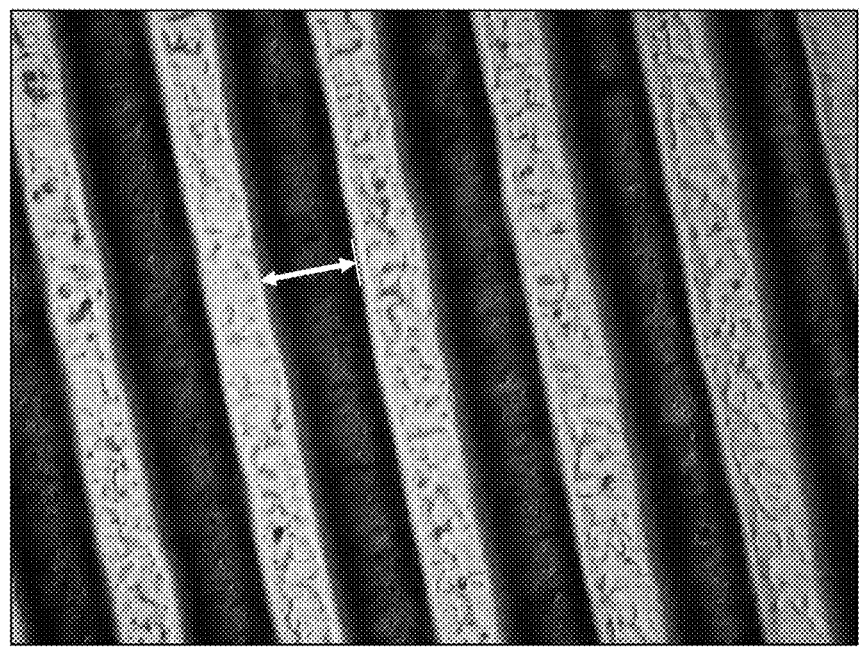
FIG. 6 shows a microscopic photograph of the etching paste line patterns formed on the front surface of the conductive nano-composite layer by using silk screen printing process. The line width shown by white arrow is about 0.2 mm. Areas appearing lighter on the photograph are electrically conductive areas.
Figure 7:
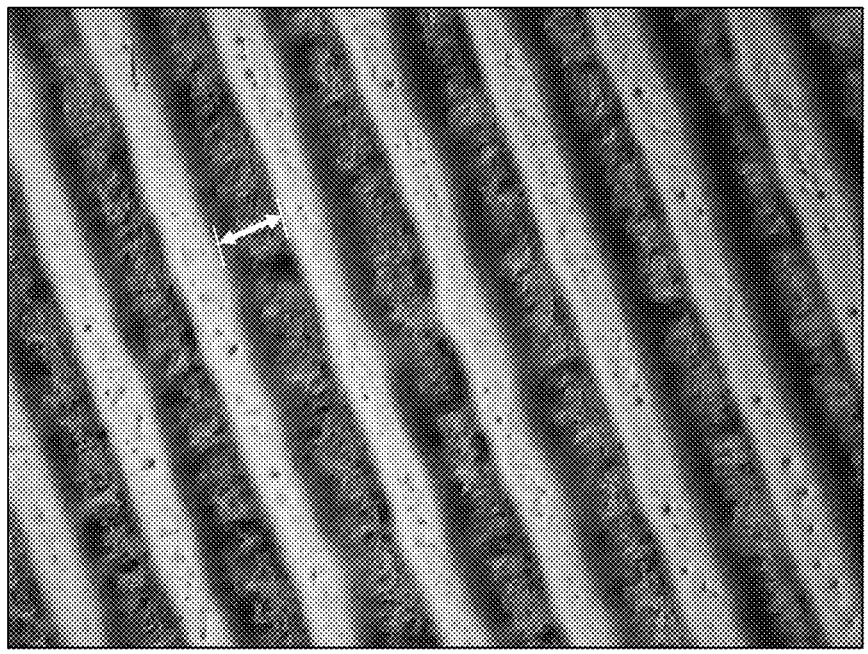
FIG. 7 shows a microscopic photograph of the etching paste line patterns formed on the front surface of the conductive nano-composite layer by using silk screen printing process. The line width shown by white arrow is about 0.15 mm. Areas appearing lighter on the photograph are electrically conductive areas.
Figure 8:
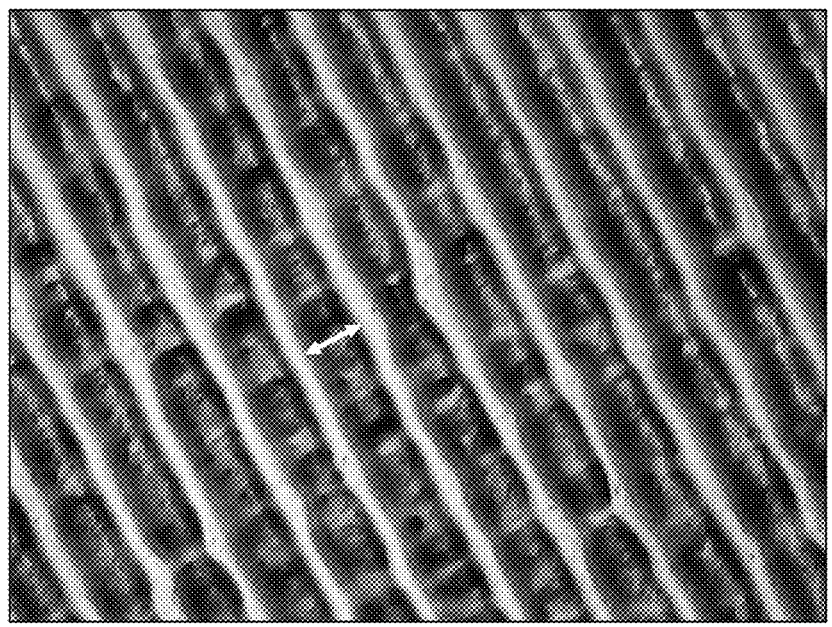
FIG. 8 shows a microscopic photograph of the etching paste line patterns formed on the front surface of the conductive nano-composite layer by using silk screen printing process. The line width shown by white arrow is about 0.1 mm. Areas appearing lighter on the photograph are electrically conductive areas.

A general silk screen printing etching process for silver nanowire nano-composite is shown in FIG. 5. First, screen printing frame with a desired etching pattern was placed on a surface of a nano-composite comprising silver nanowire. Etching paste was then printed by applying pressure using a rubber blade. After a predetermined period of time, the etching paste was washed away with water. An etched pattern was formed on the silver nanowire nano-composite.

Example 7. Etchant Compositions for Silk Screen Printing Process

Chemicals used in this example were obtained in the same manner disclosed in Example 2. Fumed silica (R972), which was used as a thixotropic material, was purchased from Evoniks Electronics. A thickener, AA-6D (H) was purchased from Dongguan Huazhuo Electronic Company Ltd. The etching power of the etching composition suitable for the silk screen printing process was evaluated by the method described in Example 2. The results are shown in the following table.

| Example | Oxidizer (wt %) | Ligand (wt %) | Solvent (wt %) | Thixotrope (wt %) | Thickener (wt %) | Etching time (min) |
|---|---|---|---|---|---|---|
| 7-1 | FeCl$_3$ (1.02) | Succinimide (1.02) | Water (4.02) | — | AA-6D (93.88) | 0.5 |
| 7-2 | FeCl$_3$ (1.01) | Lactic acid (1.01) | — | — | AA-6D (97.98) | 0.5 |
| 7-3 | FeCl$_3$ (0.98) | Succinimide (1.08) acetic acid (1.02) | — | — | AA-6D (96.93) | 0.5 |
| 7-4 | FeCl$_3$ (0.98) | Acetic acid (1.01) sodium acetate (1.01) | — | — | AA6D (97.0) | 0.5 |
| 7-5 | FeCl$_3$ (10.0) | Succinimide (10) Lactic acid (10) | — | — | AA-6D (70) | 0.5 |
| 7-6 | FeCl$_3$ (2.0) | Succinimide (2.01) lactic acid (1.01) | Ethylene glycol (2.26) polyethylene glycol (1.36) | Fumed silica (0.90) | AA-6D (90.47) | <4 |

Example 8. Silk Screen Printing of the Etchant Composition

Figure 9:
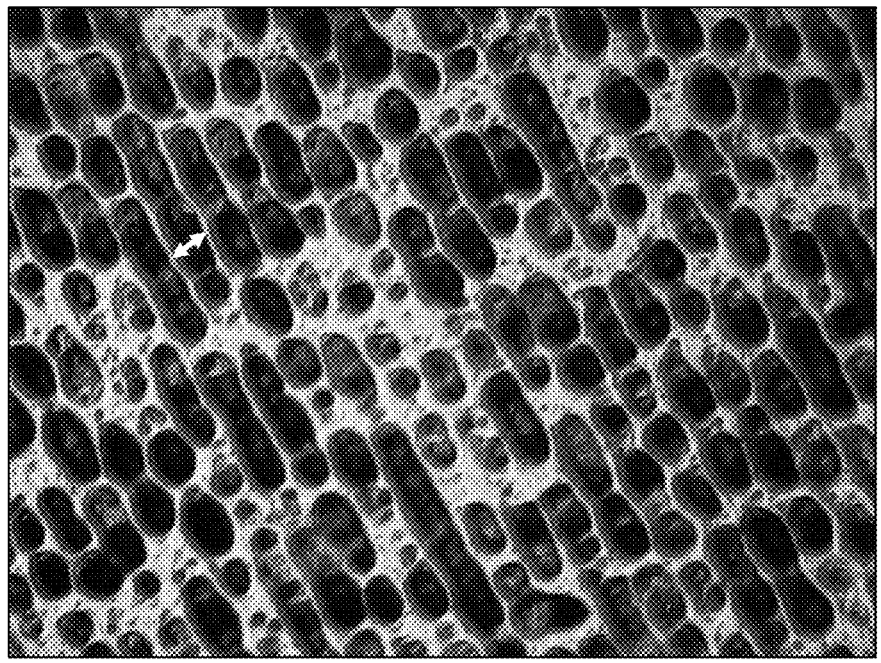
FIG. 9 shows a microscopic photograph of the etching paste line patterns formed on the front surface of the conductive nano-composite layer by using silk screen printing process. The line width shown by white arrow is about 0.05 mm. Areas appearing lighter on the photograph are electrically conductive areas.

In this example, the etching composition of Example 7-6 was used to form line patterns with different line widths by silk screen printing. The etching composition in the form of a paste was applied by using the silk screen printing method. Results are shown in FIGS. 6-9. The paste formed continuous lines with a width of about 0.2 mm. These lines had relatively straight edges. However, when the width of the formed line was narrower than about 0.15 mm, the lines did not have straight edges. That is, the line width slightly varied along the formed line. The formed lines were not continuous when the line width was about 0.05 mm, as shown in FIG. 9.

Figure 10:
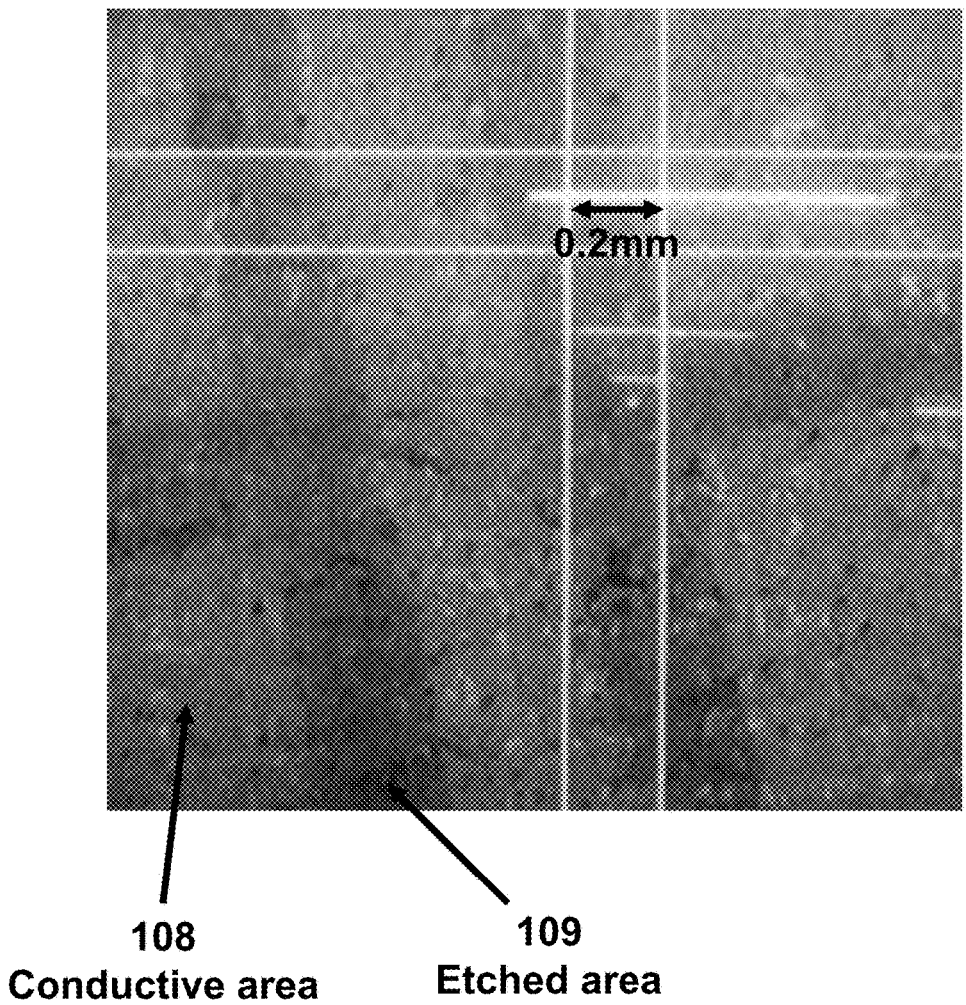
FIG. 10 shows a microscopic photograph of the part of a 7-inch touch sensor formed on a front surface of a conductive nano-composite layer after silk screen printing and etching process. Lines appearing darker on the photograph were formed after removal of material from the front surface of the conductive nanocomposite layer. Areas appearing lighter on the photograph are electrically conductive areas. The distance between two white lines shown by black arrow is about 0.2 mm.

Example 9. Touch Sensor by Screen Printing Etching of Silver Nanowire Nanocomposite About 7-inch size touch sensor electrode was made by silk screen printing process using the etchant of Example 7-6. In this example, a screen printing frame designed for a sensor pattern was used. FIG. 10 shows the part of the sensor that has etched line (dark) and conductive area (light).

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Any combination of features of processes and products disclosed above is within the scope of this disclosure. Any combination of the etching compositions and/or the chemical compounds disclosed above is within the scope of this disclosure.

Unless otherwise stated, all measurements, values, ratings, positions, magnitudes, sizes, and other specifications that are set forth in this specification, including in the exemplary features that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

In this disclosure and the appended claims, the singular forms "a," "an" and "the" include plural referents unless the context clearly dictates otherwise. That is, in this disclosure, the indefinite article "a," "an," and phrases "one or more" and "at least one" are synonymous and mean "at least one".

The phrase "means for" when used in a feature is intended to and should be interpreted to embrace the corresponding structures and materials that have been described and their equivalents. Similarly, the phrase "step for" when used in a feature is intended to and should be interpreted to embrace the corresponding acts that have been described and their equivalents. The absence of these phrases from a feature means that the feature is not intended to and should not be interpreted to be limited to these corresponding structures, materials, or acts, or to their equivalents.

The scope of protection is not limited solely by the exemplary features that now follow. That scope is intended and should be interpreted to be as broad as is consistent with the ordinary meaning of the language that is used in the features when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or features are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the features. In addition, various features in the foregoing detailed description are grouped together in various embodiments to streamline the disclosure. Some exemplary features of products and methods of the instant disclosure may be summarized as follows.

The invention claimed is:

1. An etching composition suitable for etching a silver nanowire incorporated in a transparent conductive nanocomposite layer comprising:
   at least one oxidizing agent;
   at least one ligand;
   at least one solvent; and
   a nanoparticle;
   wherein the at least one oxidizing agent is a first chemical compound that can react with silver to form a silver compound;
   wherein the at least one ligand is a second chemical compound that can react with the silver compound to form a water soluble coordination complex of silver ion;
   wherein concentration of the at least one solvent is in the range of greater than 90% by weight to 99% by weight;
   wherein concentration of the at least one ligand is in the range of greater than 5.0% by weight to 20% by weight; and
   wherein the nanoparticle comprises silica, titanium dioxide, a nanoclay, or any combination thereof.

2. The etching composition of claim 1, wherein the at least one oxidizing agent comprises an iron(III) salt, a copper(II) salt, or any combination thereof.

3. The etching composition of claim 1, wherein the at least one oxidizing agent comprises iron(III) chloride, $FeCl_3$; iron(III) sulfate, $Fe_2(SO_4)_3$; iron(III) sulfamate, $Fe(SO_3NH_2)_3$; iron mesylate, $Fe(SO_3CH_3)_3$; copper(II) chloride, $CuCl_2$; $KMnO_4$; or any combination thereof.

4. The etching composition of claim 1, wherein the at least one ligand comprises acetic acid, lactic acid, citric acid, malic acid, succinimide, 5,5 dimethyl hydantoin, sodium acetate, potassium acetate, a buffer solution, or any combination thereof.

5. The etching composition of claim 1, wherein the at least one oxidizing agent comprises iron(III) chloride, $FeCl_3$; iron(III) sulfate, $Fe_2(SO_4)_3$; iron(III) sulfamate, $Fe(SO_3NH_2)_3$; iron mesylate, $Fe(SO_3CH_3)_3$; copper(II) chloride, $CuCl_2$; $KMnO_4$; or any combination thereof; and the at least one ligand comprises acetic acid, lactic acid, citric acid, malic acid, succinimide, 5,5 dimethyl hydantoin, sodium acetate, potassium acetate, a buffer solution, or any combination thereof.

6. The etching composition of claim 1, wherein the at least one ligand comprises a buffer solution; and wherein the buffer comprises an acid and its salt.

7. The etching composition of claim 1, wherein the at least one ligand comprises a buffer solution; and wherein the buffer solution comprises acetic acid and sodium acetate; or acetic acid and potassium acetate; or lactic acid and sodium lactate; or lactic acid and potassium lactate; or any combination thereof.

8. The etching composition of claim 1, wherein the at least one oxidizing agent comprises $FeCl_3$.

9. The etching composition of claim 1, wherein the at least one oxidizing agent comprises $FeCl_3$; and the ligand comprises acetic acid, lactic acid, citric acid, malic acid, succinimide, or any combination thereof.

10. The etching composition of claim 1, wherein the at least one oxidizing agent comprises $Fe_2(SO_4)_3$.

11. The etching composition of claim 1, wherein the at least one oxidizing agent comprises $Fe_2(SO_4)_3$; and the ligand comprises acetic acid, lactic acid, citric acid, malic acid, succinimide, or any combination thereof.

12. The etching composition of claim 1, wherein the at least one oxidizing agent comprises iron(III) sulfamate, $Fe(SO_3NH_2)_3$.

13. The etching composition of claim 1, wherein the at least one oxidizing agent comprises iron(III) sulfamate, $Fe(SO_3NH_2)_3$; and the ligand comprises acetic acid, lactic acid, citric acid, malic acid, succinimide, or any combination thereof.

14. The etching composition of claim 1, wherein the at least one oxidizing agent comprises iron mesylate, $Fe(SO_3CH_3)_3$.

15. The etching composition of claim 1, wherein the at least one oxidizing agent comprises iron mesylate, $Fe(SO_3CH_3)_3$; and the ligand comprises acetic acid, lactic acid, citric acid, malic acid, succinimide, or any combination thereof.

16. The etching composition of claim 1, wherein the at least one oxidizing agent comprises $KMnO_4$; and the ligand comprises acetic acid; and wherein the etching composition further comprises water.

17. The etching composition of claim 1, wherein the at least one oxidizing agent comprises $KMnO_4$; and the ligand comprises acetic acid and sodium acetate; and wherein the etching composition further comprises water.

18. The etching composition of claim 1, wherein the at least one oxidizing agent comprises $KMnO_4$; and the ligand comprises acetic acid and potassium acetate; and wherein the etching composition further comprises water.

19. The etching composition of claim 1, wherein the solvent comprises water, an organic solvent, or any combination thereof.

20. The etching composition of claim 1, wherein the solvent comprises an alcohol, a glycol, or any combination thereof.

21. The etching composition of claim 1, wherein the solvent comprises a glycol; and wherein the glycol comprises ethylene glycol, polyethylene glycol, polypropylene glycol, ethylene glycol monomethyl ether, ethylene glycol monoethyl ether, propylene glycol monomethyl ether, propylene glycol monoethyl ether, methyl ethyl ketone, or any combination thereof.

22. The etching composition of claim 1, wherein the etching composition further comprises a thickening agent; and wherein the thickening agent comprises a cellulose derivative, a starch, a starch derivative, xanthan, polyvinylpyrrolidone, polyethylene glycol, a nanoparticle, or any combination thereof.

23. The etching composition of claim 1, wherein the etching composition further comprises a thickening agent, and wherein the thickening agent comprises a cellulose derivative.

24. The etching composition of claim 1, wherein the etching composition further comprises a cellulose derivative; and wherein the cellulose derivative comprises a water soluble cellulose derivative.

25. The etching composition of claim 1, wherein the etching composition further comprises an additive; and the additive comprises an antifoaming agent, a thixotropic agent, a flow control agent, a deaerating agent, an adhesion promoter, or any combination thereof.

26. The etching composition of claim 1, wherein the at least one oxidizing agent comprises $FeCl_3$; and the at least one ligand comprises succinimide, and lactic acid; and wherein the etching composition further comprises a thickener.

27. The etching composition of claim 1, wherein the at least one oxidizing agent comprises iron(III) sulfate $Fe_2(SO_4)_3$; and the at least one ligand comprises succinimide and lactic acid; and wherein the etching composition further comprises a thickener.

28. The etching composition of claim 1, wherein the at least one oxidizing agent comprises iron(III) sulfamate $Fe(SO_3NH_2)_3$; and the at least one ligand comprises succinimide and lactic acid; and wherein the etching composition further comprises a thickener.

29. The etching composition of claim 1, wherein the at least one oxidizing agent comprises iron mesylate $Fe(SO_3CH_3)_3$; and the at least one ligand comprises succinimide and lactic acid; and wherein the etching composition further comprises a thickener.

30. The etching composition of claim 1, wherein the concentration of the ligand is in the range of 0.001% by weight to less than 11% by weight.

31. The etching composition of claim 1, wherein the concentration of the ligand is in the range of 0.1% by weight to 10% by weight.

32. The etching composition of claim 1, wherein the concentration of the oxidizing agent is in the range of 0.001% by weight to less than 11% by weight.

33. The etching composition of claim 1, wherein the concentration of the oxidizing agent is in the range of 0.1% by weight to 10% by weight.

34. The etching composition of claim 1, wherein the at least one solvent comprises water, and wherein the concentration of water is in the range of 91% by weight to 99% by weight.

35. The etching composition of claim 1, wherein the at least one solvent comprises water, and wherein the concentration of water is in the range of 95% by weight to 99% by weight.

36. The etching composition of claim 1, wherein the at least one solvent comprises water and at least one organic solvent; wherein the concentration of water is in the range of greater than 89% by weight to 98% by weight; and wherein the concentration of the at least one organic solvent is in the range of 1% by weight to less than 10% by weight.

37. The etching composition of claim 1, wherein the at least one solvent comprises water and at least one organic solvent; wherein the concentration of water is in the range of 1% by weight to less than 10% by weight; and wherein the concentration of the at least one solvent is in the range of greater than 89% by weight to 98% by weight.

38. The etching composition of claim 1, wherein the concentration of the at least one solvent is in the range of greater than 95% by weight to 99% by weight.

* * * * *